(12) United States Patent
Song et al.

(10) Patent No.: US 12,451,849 B2
(45) Date of Patent: Oct. 21, 2025

(54) AUDIO AMPLIFYING CIRCUIT AND PLAYING DEVICE

(71) Applicant: RDA Microelectronics (Shanghai) Co., Ltd., Shanghai (CN)

(72) Inventors: Yiwei Song, Shanghai (CN); Tao Zhou, Shanghai (CN)

(73) Assignee: RDA MICROELECTRONICS (SHANGHAI) CO., LTD., Shanghai (CN)

( * ) Notice: Subject to any disclaimer, the term of this patent is extended or adjusted under 35 U.S.C. 154(b) by 618 days.

(21) Appl. No.: 17/849,599

(22) Filed: Jun. 25, 2022

(65) Prior Publication Data

US 2022/0329218 A1 Oct. 13, 2022

Related U.S. Application Data

(63) Continuation-in-part of application No. PCT/CN2020/116583, filed on Sep. 21, 2020, and a
(Continued)

(30) Foreign Application Priority Data

Dec. 25, 2019 (CN) .......................... 201922357764.7
Dec. 25, 2019 (CN) .......................... 201922370332.X (51) Int. Cl.
*H03F 3/213* (2006.01)
*H03F 3/181* (2006.01)
(Continued)

(52) U.S. Cl.
CPC ............. *H03F 3/213* (2013.01); *H03F 3/181* (2013.01); *H03F 3/45475* (2013.01);
(Continued)

(58) Field of Classification Search
CPC .......... H03F 3/213; H03F 3/181; H03F 3/183; H03F 2200/03; H03F 2203/45138;
(Continued)

(56) References Cited

U.S. PATENT DOCUMENTS 6,738,601 B1 * 5/2004 Rofougaran ....... H03H 11/1291
455/66.1
8,103,010 B2 1/2012 Maruko et al.
(Continued)

FOREIGN PATENT DOCUMENTS

CN 1713515 A 12/2005
CN 102291094 A 12/2011
(Continued)

OTHER PUBLICATIONS

The Working Theory of an RC Coupled Amplifier in Electronics, https://www.elprocus.com/working-theory-of-an-rc-coupled-amplifier/ , Elprocus (Year: 2013).*
(Continued)

*Primary Examiner* — Andrea Lindgren Baltzell
*Assistant Examiner* — Lance Torbjorn Bartol
(74) *Attorney, Agent, or Firm* — Kilpatrick Townsend & Stockton LLP (57) ABSTRACT

The present disclosure provides an audio amplifying circuit and a playing device, including: N-order filters and an integrated circuit; after an original audio signal passes through the N-order filters, a filtered signal is obtained; after the filtered signal passes through the integrated circuit, a corresponding digital signal is output; where the number of operational amplifiers adopted in the N-order filters is smaller than N, and N is a natural number greater than 1.

12 Claims, 9 Drawing Sheets

Related U.S. Application Data continuation-in-part of application No. PCT/CN2020/116571, filed on Sep. 21, 2020.

(51) Int. Cl.
  *H03F 3/45* (2006.01)
  *H03H 11/12* (2006.01)
  *H03H 19/00* (2006.01)

(52) U.S. Cl.
  CPC ....... *H03H 11/1217* (2013.01); *H03H 11/126* (2013.01); *H03H 11/1291* (2013.01); *H03H 19/004* (2013.01); *H03F 2200/03* (2013.01)

(58) Field of Classification Search
  CPC ..... H03F 3/45; H03F 3/45475; H03H 11/126; H03H 11/1291; H03H 19/004; H03H 11/291; H03H 11/1217
  USPC ........................................................ 330/185
  See application file for complete search history.

(56) References Cited

U.S. PATENT DOCUMENTS

| | | | |
|---|---|---|---|
| 2005/0179505 A1* | 8/2005 | Di Giandomenico | H03H 11/126 333/17.1 |
| 2015/0054578 A1 | 2/2015 | Yuan et al. | |
| 2015/0229292 A1* | 8/2015 | Cho | H03M 3/43 327/552 |
| 2018/0062583 A1* | 3/2018 | Zhao | H03F 3/2173 |
| 2019/0199327 A1* | 6/2019 | Huang | H03F 3/45475 |
| 2019/0393915 A1* | 12/2019 | Miller | H03H 11/1291 |

FOREIGN PATENT DOCUMENTS

| | | | | |
|---|---|---|---|---|
| CN | 102378085 A | | 3/2012 | |
| CN | 102832893 A | | 12/2012 | |
| CN | 103199800 A | | 7/2013 | |
| CN | 103457572 A | | 12/2013 | |
| CN | 103634726 A | | 3/2014 | |
| CN | 108347670 A | | 7/2018 | |
| CN | 207869069 U | | 9/2018 | |
| CN | 109756195 A | * | 5/2019 | |
| CN | 109995364 A | | 7/2019 | |
| CN | 210274516 U | | 4/2020 | |
| CN | 210518805 U | | 5/2020 | |
| JP | 3941443 B2 | * | 7/2007 | ........... H03F 3/2173 |
| KR | 20180087846 A | * | 8/2018 | |

OTHER PUBLICATIONS

Kang et al., Class-D Audio Amplifier Using 1-Bit Fourth-Order Delta Sigma Modulation, IEEE (Year: 2008).*
International Search Report and Written Opinion mailed in International Application PCT/CN2020/116571 on Dec. 23, 2020.
International Search Report and Written Opinion mailed in International Application PCT/CN2020/116583 on Dec. 21, 2020.
The Notification to Grant Patent Right for Invention received in CN Application 201922357764.7 on Jan. 3, 2020.
The Notification to Grant Patent Right for Invention received in CN Application 201922370332.X on Apr. 1, 2020.

* cited by examiner

FIG. 9

AUDIO AMPLIFYING CIRCUIT AND PLAYING DEVICE

CROSS-REFERENCE TO RELATED APPLICATIONS

This application is a continuation-in-part of International Application No. PCT/CN2020/116583 and International Application No. PCT/CN2020/116571, where International Application No. PCT/CN2020/116583 claims priority to Chinese Patent Application No. 201922370332.X, filed with the China National Intellectual Property Administration on Dec. 25, 2019, entitled "Amplifying Circuit and Playing Device", and International Application No. PCT/CN2020/116571 claims priority to Chinese Patent Application No. 201922357764.7, filed with the China National Intellectual Property Administration on Dec. 25, 2019, entitled "Audio Amplifying Circuit and Playing Device". All of the aforementioned patent applications are hereby incorporated by reference in their entireties.

TECHNICAL FIELD

The present disclosure relates to the technical field of integrated circuits, and in particular, to an audio amplifying circuit and a playing device.

BACKGROUND

Audio amplifying circuits usually adopt two-stage filtering processing, where the filter adopts an operational amplifier, and for filtered signals, analog signals are converted into digital signals through a digital circuit, and finally audio signals are output by a player.

SUMMARY

The present disclosure provides an audio amplifying circuit and a playing device. On the premise of ensuring the filtering effect, a circuit area occupied by the audio amplifying circuit and power consumption are reduced by reducing the number of operational amplifiers used in the N-order filters.

In a first aspect, an embodiment of the present disclosure provides an audio amplifying circuit, including: N-order filters and an integrated circuit; after an original audio signal passes through the N-order filters, a filtered signal is obtained; after the filtered signal passes through the integrated circuit, a corresponding digital signal is output; where the number of operational amplifiers adopted in the N-order filters is smaller than N, and N is a natural number greater than 1.

In a second aspect, an embodiment of the present disclosure further provides an audio amplifying circuit, including: filters, a weighting adder, an integrated circuit and a player; where after a first-path original audio signal passes through the filters, a filtered signal is obtained; a second-path original audio signal and the filtered signal are weighted and added through the weighting adder to obtain a weighted addition signal; and the weighted addition signal passes through the integrated circuit and the player in sequence to output an audio signal.

In a third aspect, an embodiment of the present disclosure further provides a playing device, including the audio amplifying circuit according to any one of the first aspect and the second aspect.

BRIEF DESCRIPTION OF DRAWINGS

In order to illustrate the technical solution of the embodiments of the present disclosure more clearly, in the following, the drawings that need to be used in the description of the embodiments will be introduced briefly. Obviously, the drawings in the following description are some embodiments of the present disclosure. For those of ordinary skills in the art, other drawings can be obtained according to these drawings without making creative efforts.

Through the above drawings, specific embodiments of the present disclosure have been shown, which will be described in more detail later. These drawings and text descriptions are not intended to limit the scope of the concepts of the present disclosure in any way, but to illustrate the concepts of the present disclosure to those skilled in the art by referring to specific embodiments.

DESCRIPTION OF EMBODIMENTS

In order to make the purpose, technical solution and advantages of the embodiments of the present disclosure clearer, the technical solution in the embodiments of the present disclosure will be clearly and completely described below with reference to the drawings in the embodiments of the present disclosure. Obviously, the described embodiments are part of the embodiments of the present disclosure, but not all of them. Based on the embodiments in the present disclosure, all other embodiments obtained by those of ordinary skills in the art without making creative efforts belong to the protection scope of the present disclosure.

The terms "first", "second", "third" and "fourth" in the specification and claims of the present disclosure and in the above drawings (if any), are used to distinguish similar objects, and are not necessarily used to describe a specific order or sequence. It should be understood that the data used in such way can be interchanged under appropriate circumstances, so that the embodiments of the present disclosure described here can be implemented, for example, in sequences other than those illustrated or described here. In addition, the terms "including" and "having" and any variations thereof are intended to cover non-exclusive inclusion. For example, a process, method, system, product or device that includes a series of steps or units are not necessarily limited to those steps or units that are clearly listed, but may include other steps or units that are not clearly listed or inherent to these processes, methods, products or devices.

The technical solution of the present disclosure will be described in detail in the following specific embodiments. The following specific embodiments can be combined with each other, and the same or similar concepts or processes may not be described in detail in some embodiments.

Existing audio amplifying circuits usually adopt two-stage filtering processing, where the filter adopts an operational amplifier (for example, a complementary metal oxide semiconductor (CMOS) operational amplifier), and the filtered signals are converted into digital signals through a CMP digital circuit, and finally audio signals are output by a player. The more the number of filters in the audio amplifying circuit is, the higher the gain is and the stronger the anti-interference ability of the circuit is. However, in the integrated circuit, the operational amplifier needs to occupy a large circuit area, and it will increase the power consumption of the audio amplifying circuit. In addition, CMOS components are voltage-controlled components, when the original audio signal is filtered twice, it will be doped with harmonic interference signals, which will make the linearity of the filtered signal worse and affect the quality of the final output audio signal. In view of the above problems, the present disclosure provides an audio amplifying circuit. On the premise of ensuring the filtering effect, the circuit area occupied by the audio amplifying circuit and power consumption are reduced by reducing the number of operational amplifiers used in the N-order filters. Furthermore, the present disclosure also provides an audio amplifying circuit, which improves the linearity of the signal and the quality of the audio signal by performing feed forward processing on the signal entering the integrated circuit.

In the following, the technical solution of the present disclosure and how the technical solution of the present disclosure solves the above technical problem will be described in detail with reference to the specific embodiments. The following specific embodiments can be combined with each other, and the same or similar concepts or processes may not be described in detail in some embodiments. The embodiments of the present disclosure will be described with reference to the drawings.

Embodiment 1

Figure 1:
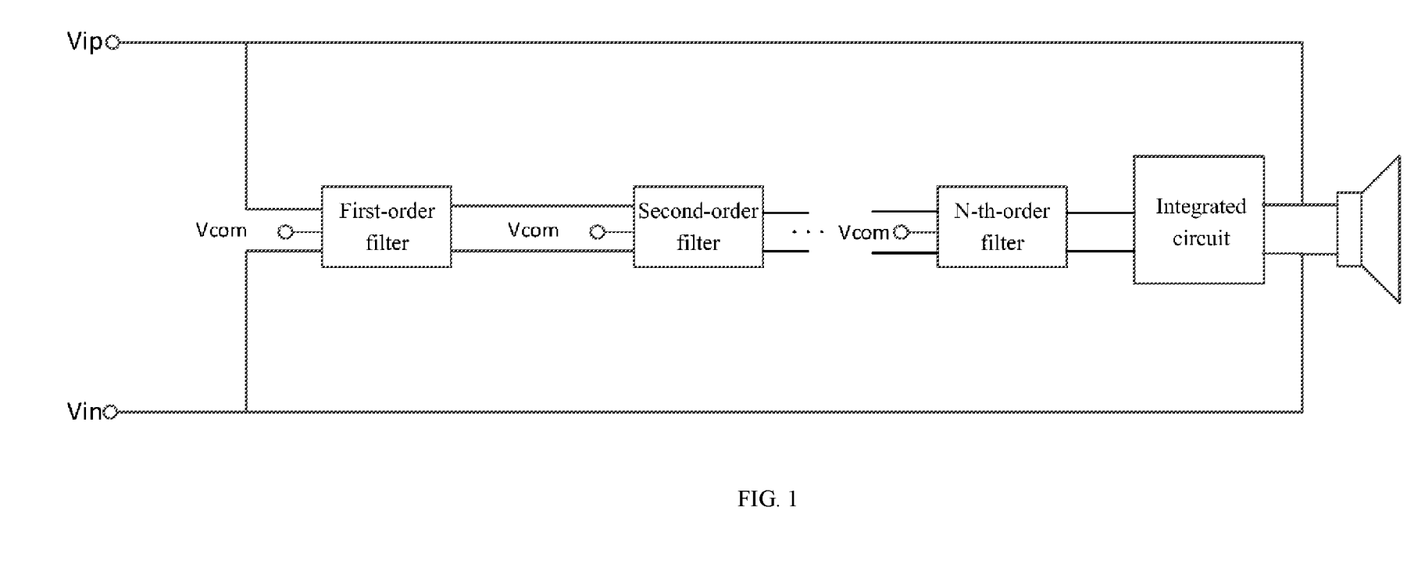
FIG. 1 is a schematic structural diagram of an audio amplifying circuit provided by a first embodiment of the present disclosure.

FIG. 1 is a schematic structural diagram of an audio amplifying circuit provided by a first embodiment of the present disclosure. As shown in FIG. 1, the audio amplifying circuit of the present embodiment may include: N-order filters and an integrated circuit; after an original audio signal passes through the N-order filters, a filtered signal is obtained; after the filtered signal passes through the integrated circuit, a corresponding digital signal is output; where the number of operational amplifiers adopted in the N-order filters is smaller than N, and N is a natural number greater than 1.

Specifically, as shown in FIG. 1, a positive input end of a first-order filter receives a positive signal Vip of the original audio signal, a negative input end of the first-order filter receives a negative signal Vin of the original audio signal, and a reference end of the first-order filter receives a reference signal Vcom. A positive output end of a previous-order filter connects to a positive input end of a next-order filter, a negative output end of the previous-order filter connects to a negative input end of the next-order filter. A positive output end and a negative output end of a last-order filter connect to an input end of the integrated circuit, and an output end of the integrated circuit connects to a player.

According to the audio amplifying circuit of the present embodiment, on the premise of ensuring the filtering effect, the circuit area occupied by the audio amplifying circuit and power consumption are reduced by reducing the number of operational amplifiers used in the N-order filters.

Embodiment 2

Figure 2:
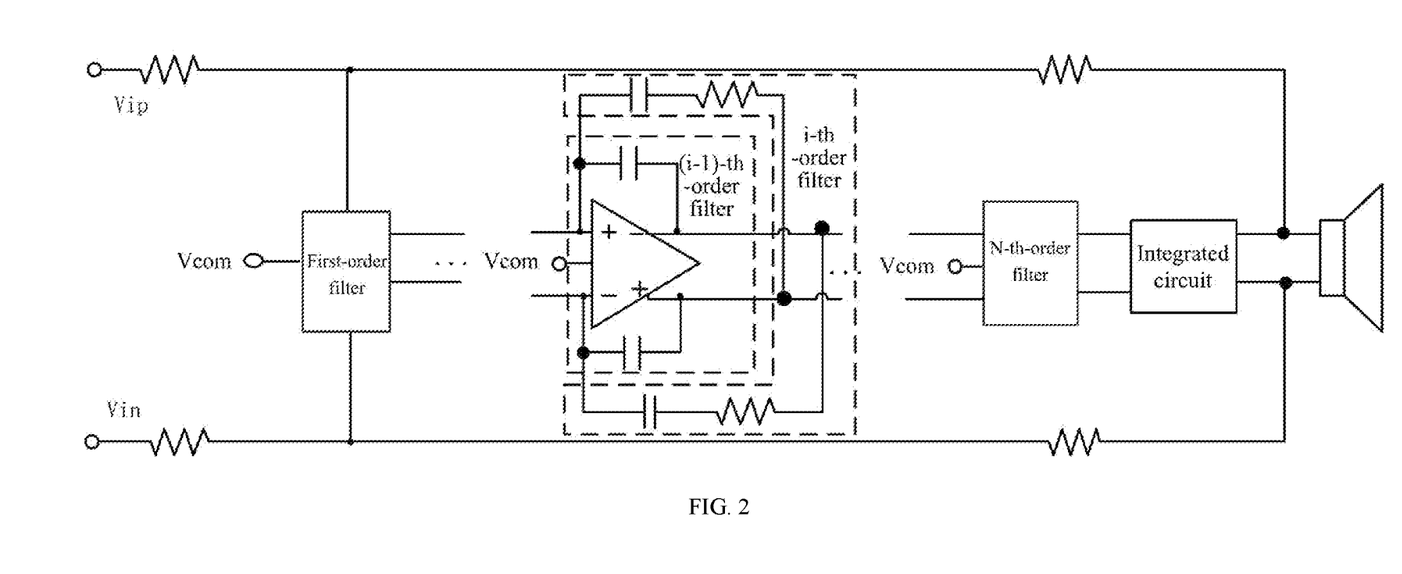
FIG. 2 is a schematic structural diagram of an audio amplifying circuit provided by a second embodiment of the present disclosure.

FIG. 2 is a schematic structural diagram of an audio amplifying circuit provided by a second embodiment of the present disclosure. As shown in FIG. 2, the audio amplifying circuit of the present embodiment may include: N-order filters and an integrated circuit; after an original audio signal passes through the N-order filters, a filtered signal is obtained; after the filtered signal passes through the integrated circuit, a corresponding digital signal is output; where the number of operational amplifiers adopted in the N-order filters is smaller than N, and N is a natural number greater than 1.

In an optional implementation, referring to FIG. 2, the N-order filters include an (i−1)-th-order filter, where i ranges among 2, 3, . . . , N. The (i−1)-th-order filter is a first-type filter, where the first-type filter includes: the operational amplifier, a first capacitor and a second capacitor; a positive input end of the operational amplifier is connected to a positive output end of a previous-order filter, a negative input end of the operational amplifier is connected to a negative output end of the previous-order filter, a positive output end of the operational amplifier constitutes a positive output end of the filter, a negative output end of the operational amplifier constitutes a negative output end of the filter, an end of the first capacitor is connected to the positive input end of the operational amplifier, and the other end of the first capacitor is connected to the negative output end of the operational amplifier; an end of the second capacitor is connected to the negative input end of the operational amplifier, and the other end of the second capacitor is connected to the positive output end of the operational amplifier.

In an optional implementation, the N-order filters further include an i-th-order filter, where the i-th-order filter is a second-type filter, and the structure of the second-type filter may be designed in multiple ways.

In a possible design, the second-type filter includes: a third capacitor, a first resistor, a fourth capacitor and a second resistor; an end of the third capacitor is connected to the positive input end of the (i−1)-th-order filter, the other end of the third capacitor is connected to an end of the first resistor, and the other end of the first resistor is connected to the positive output end of the (i−1)-th-order filter; an end of the fourth capacitor is connected to the negative input end of the (i−1)-th-order filter, the other end of the fourth capacitor is connected to an end of the second resistor, and the other end of the second resistor is connected to the negative output end of the (i−1)-th-order filter.

In another possible design, the second-type filter includes: a third capacitor, a first switched capacitor, a fourth capacitor and a second switched capacitor. An end of the third capacitor is connected to the positive input end of the (i−1)-th-order filter, the other end of the third capacitor is connected to an end of the first switched capacitor, and the other end of the first switched capacitor is connected to the positive output end of the (i−1)-th-order filter. An end of the fourth capacitor is connected to a negative input end of the (i−1)-th-order filter, the other end of the fourth capacitor is connected to an end of the second switched capacitor, and the other end of the second switched capacitor is connected to the negative output end of the (i−1)-th-order filter.

It shall be noted that the number of filters is not limited in the present embodiment.

It shall be noted that capacitance values of the third capacitor and the fourth capacitor of the i-th-order filter and the first capacitor and the second capacitor of the (i−1)-th-order filter are the same.

In the audio amplifying circuit, an original audio signal passes through the N-order filters to obtain a filtered signal; after the filtered signal passes through the integrated circuit, a corresponding digital signal is output; where the number of operational amplifiers adopted in the N-order filters is smaller than N, and N is a natural number greater than 1. According to the audio amplifying circuit of the present disclosure, on the premise of ensuring the filtering effect, the circuit area occupied by the audio amplifying circuit and power consumption are reduced by reducing the number of operational amplifiers used in the N-order filters.

Embodiment 3

Figure 3:
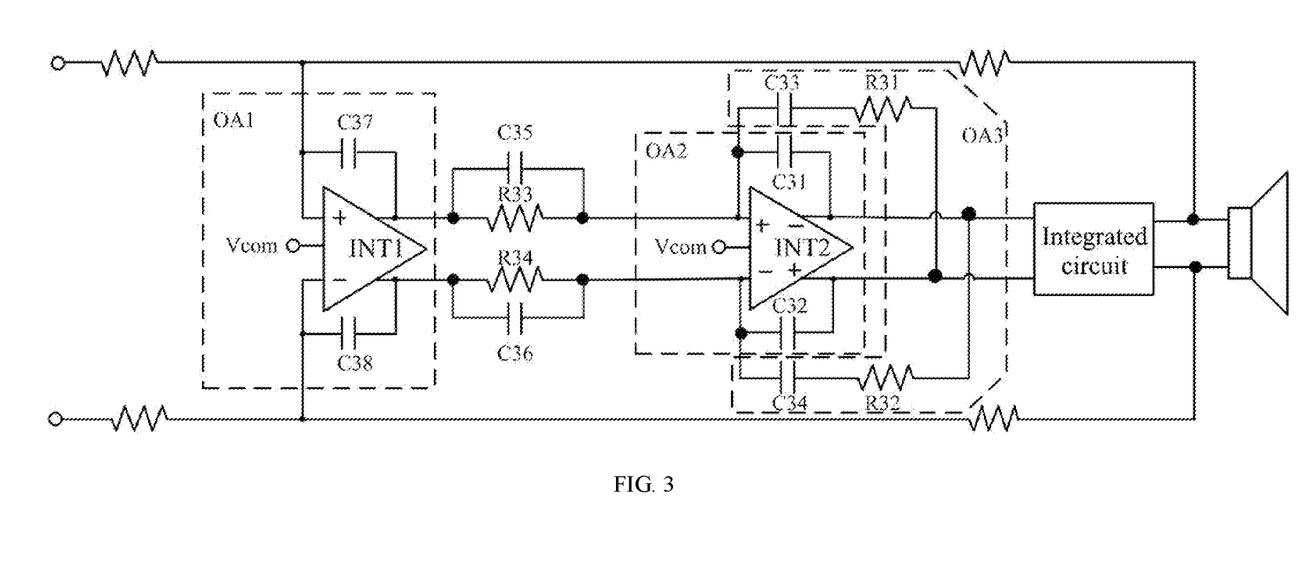
FIG. 3 is a schematic structural diagram of an audio amplifying circuit provided by a third embodiment of the present disclosure.

FIG. 3 is a schematic structural diagram of an audio amplifying circuit provided by a third embodiment of the present disclosure. As shown in FIG. 3, the audio amplifying circuit of the present embodiment may include: N-order filters and an integrated circuit; after an original audio signal passes through the N-order filters, a filtered signal is obtained; after the filtered signal passes through the integrated circuit, a corresponding digital signal is output; where the number of operational amplifiers adopted in the N-order filters is smaller than N, and N is a natural number greater than 1.

As shown in FIG. 3, three-order filters will be taken as an example for description. FIG. 3 shows a first-order filter OA1, a second-order filter OA2 and a third-order filter OA3.

Specifically, the first-order filter OA1 includes: a first operational amplifier INT1 and two capacitors (i.e. C37 and C38), a positive input end of the first operational amplifier INT1 is connected to a positive output end of the first operation amplifier INT1 through a capacitor C37, and a negative input end of the first operational amplifier INT1 is connected to a negative output end of the first operation amplifier INT1 through a capacitor C38. The positive input end of the first operational amplifier INT1 constitutes a positive input end of the first-order filter, the negative input end of the first operational amplifier INT1 constitutes a negative input end of the first-order filter, the positive output end of the first operational amplifier INT1 constitutes a positive output end of the first-order filter, and the negative output end of the first operational amplifier INT1 constitutes a negative output end of the first-order filter. The second-order filter OA2 includes: a second operational amplifier INT2, a first capacitor C31 and a second capacitor C32; a positive input end of the second operational amplifier INT2 is connected to a positive output end of a previous-order filter, a negative input end of the second operational amplifier INT2 is connected to a negative output end of the previous-order filter, a positive output end of the second operational amplifier INT2 constitutes a positive output end of the second-order filter, a negative output end of the second operational amplifier INT2 constitutes a negative output end of the second-order filter, an end of the first capacitor C31 is connected to the positive input end of the second operational amplifier INT2, and the other end of the first capacitor C31 is connected to the negative output end of the second operational amplifier INT2; an end of the second capacitor C32 is connected to the negative input end of the second operational amplifier INT2, and the other end of the second capacitor C32 is connected to the positive output end of the second operational amplifier INT2. The third-order filter OA3 includes: a third capacitor C33, a first resistor R31, a fourth capacitor C34 and a second resistor R32; an end of the third capacitor C33 is connected to the positive input end of the second operational amplifier INT2, the other end of the third capacitor C33 is connected to an end of the first resistor R31, and the other end of the first resistor R31 is connected to the positive output end of the second operational amplifier INT2; an end of the fourth capacitor C34 is connected to the negative input end of the second operational amplifier INT2, the other end of the fourth capacitor C34 is connected to an end of the second resistor R32, and the other end of the second resistor R32 is connected to the negative output end of the second operational amplifier INT2.

In an optional implementation, the N-order filters further include an i-th-order filter, and the i-th-order filter is a first-type filter, and at this time the circuit may include other elements. In an optional implementation, the circuit further includes: a third resistor and a fourth resistor; the positive output end of the operational amplifier in the (i−1)-th-order filter is connected to the positive input end of the operational amplifier of the i-th-order filter through the third resistor; the negative output end of the operational amplifier in the (i−1)-th-order filter is connected to the negative input end of the operational amplifier of the i-th-order filter through the fourth resistor.

In another optional implementation, the circuit may further include, in addition to the third resistor and the fourth resistor: a fifth capacitor and the sixth capacitor; an end of the fifth capacitor is connected to the positive output end of the operational amplifier in the (i−1)-th-order filter, and the other end of the fifth capacitor is connected to the positive input end of the operational amplifier in the i-th-order filter; an end of the sixth capacitor is connected to the negative output end of the operational amplifier in the (i−1)-th-order filter, and the other end of the sixth capacitor is connected to the negative input end of the operational amplifier in the i-th-order filter.

Still taking FIG. 3 as an example for description. If both the first-order filter and the second-order filter are the first-type filters, the circuit further includes: a third resistor R33, a fourth resistor R34, a fifth capacitor C35 and a sixth capacitor C36; the positive output end of the operational amplifier in the first-order filter is connected to the positive input end of the operational amplifier in the second-order filter through the third resistor R33; the negative output end of the operational amplifier in the first-order filter is connected to the negative input end of the operational amplifier in the second-order filter through the fourth resistor R34. An end of the fifth capacitor C35 is connected to the positive output end of the operational amplifier in the first-order filter, and the other end of the fifth capacitor C35 is connected to the positive input end of the operational amplifier of the second-order filter; an end of the sixth capacitor C36 is connected to the negative output end of the operational amplifier in the first-order filter, and the other end of the sixth capacitor C36 is connected to the negative input end of the operational amplifier of the second-order filter.

In the audio amplifying circuit, an original audio signal passes through the N-order filters to obtain a filtered signal; after the filtered signal passes through the integrated circuit, a corresponding digital signal is output; where the number of operational amplifiers adopted in the N-order filters is smaller than N and N is a natural number greater than 1. According to the audio amplifying circuit of the present disclosure, on the premise of ensuring the filtering effect, the circuit area occupied by the audio amplifying circuit and power consumption are reduced by reducing the number of operational amplifiers used in the N-order filters.

Embodiment 4

Figure 4:
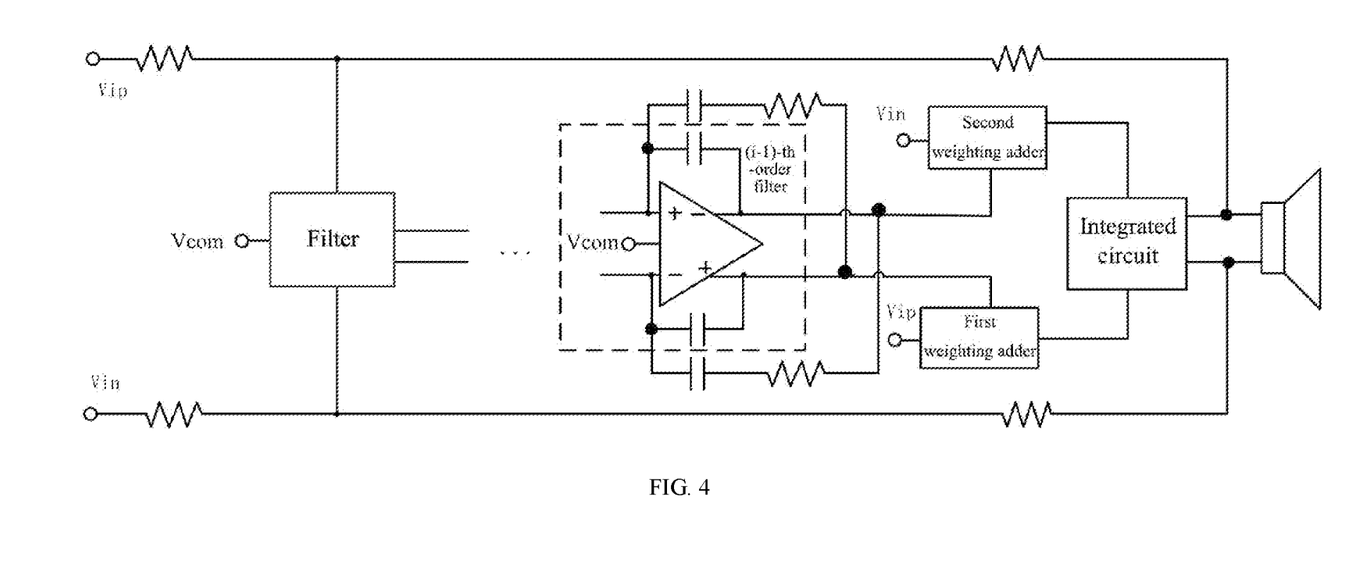
FIG. 4 is a schematic structural diagram of an audio amplifying circuit provided by a fourth embodiment of the present disclosure.
Figure 5:
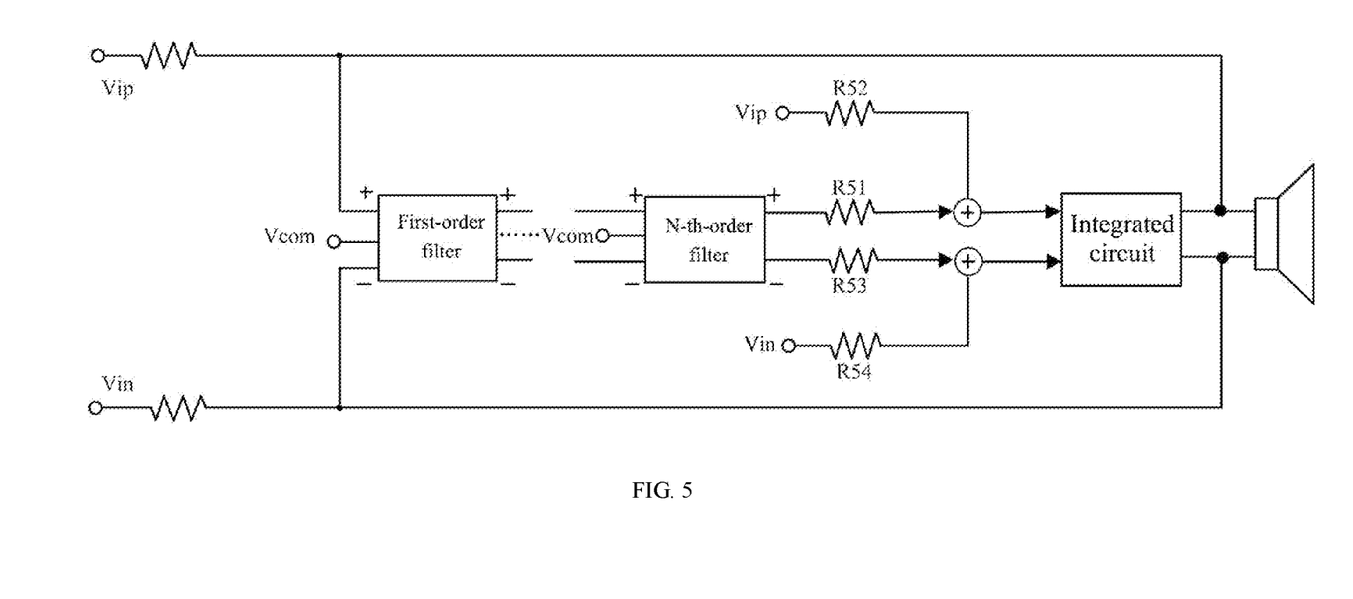
FIG. 5 is a schematic structural diagram of another audio amplifying circuit provided by the fourth embodiment of the present disclosure.
Figure 6:
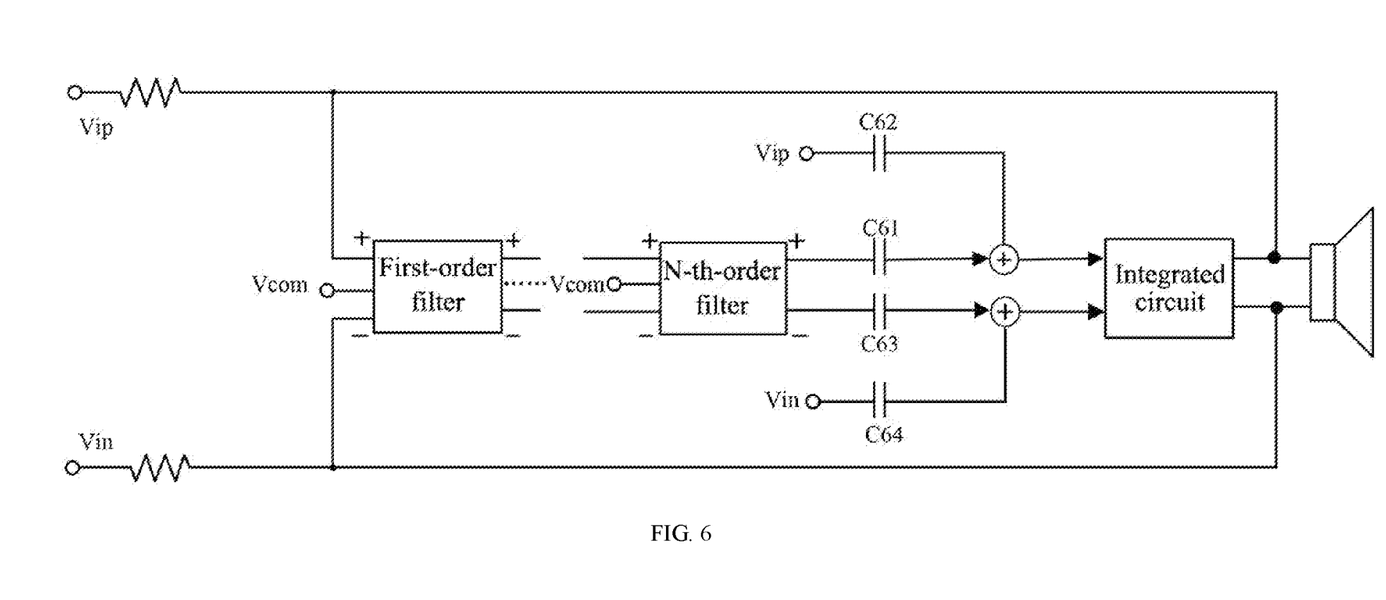
FIG. 6 is a schematic structural diagram of another audio amplifying circuit provided by the fourth embodiment of the present disclosure.

FIG. 4-FIG. 6 are schematic structural diagrams of the audio amplifying circuit provided by the fourth embodiment of the present disclosure. As shown in FIG. 4, the audio amplifying circuit in the present embodiment may include: N-order filters, a weighting adder and an integrated circuit; where after a first-path original audio signal passes through the N-order filters, a filtered signal is obtained; a second-path original audio signal and the filtered signal are weighted and added through the weighting adder to obtain a weighted addition signal; and the weighted addition signal passes through the integrated circuit and the player in sequence to output an audio signal. After the filtered signal passes through the integrated circuit, a corresponding digital signal is output; where the number of operational amplifiers adopted in the N-order filters is smaller than N and N is a natural number greater than 1.

The positive output end of the last-order filter is connected to a first input end of a first weighting adder, and the negative output end of the last-order filter is connected to a first input end of a second weighting adder. A second input end of the first weighting adder receives a positive signal Vip of the second-path original audio signal, a second input end of the second weighting adder receives a negative signal Vin of the second-path original audio signal. An output end of the first weighting adder is connected to a first input end of the integrated circuit, and the output end of the second weighting adder is connected to a second input end of the integrated circuit. The output end of the integrated circuit is connected to the player.

In an optional implementation, as shown in FIG. 5, the weighting adder includes: a fifth resistor R51, a sixth resistor R52, a seventh resistor R53 and an eighth resistor R54; an end of the fifth resistor R51 is connected to the positive output end of the last-order filter, and an end of the sixth resistor R52 is connected to the positive output end of the second-path original audio signal; the other end of the fifth resistor R51 and the other end of the sixth resistor R52 are both connected to the first input end of the integrated circuit; an end of the seventh resistor R53 is connected to the negative output end of the last-order filter, an end of the eighth resistor R54 is connected to the negative output end of the second-path original audio signal; the other end of the seventh resistor R53 and the other end of the eighth resistor R54 are both connected to the second input end of the integrated circuit.

It shall be noted that, resistance values of the fifth resistor R51, the sixth resistor R52, the seventh resistor R53 and the eighth resistor R54 are not limited by the present embodiment. Those of ordinary skills in the art may adjust a ratio of the weighted addition of the two paths of original audio signals by setting the resistance values of the fifth resistor R51, the sixth resistor R52, the seventh resistor R53 and the eighth resistor R54.

In another optional implementation, as shown in FIG. 6, the weighting adder includes: a third switched capacitor C61, a fourth switched capacitor C62, a fifth switched capacitor C63 and a sixth switched capacitor C64; an end of the third switched capacitor C61 is connected to the positive output end of the last-order filter, and an end of the fourth switched capacitor C62 is connected to the positive output end of the second-path original audio signal; the other end of the third switched capacitor C61 and the other end of the fourth switched capacitor C62 are both connected to the first input end of the integrated circuit; an end of the fifth switched capacitor C63 is connected to the negative output end of the last-order filter, an end of the sixth switched capacitor C64 is connected to the negative output end of the second-path original audio signal; the other end of the fifth switched capacitor C63 and the other end of the sixth switched capacitor C64 are both connected to the second input end of the integrated circuit.

It shall be noted that, capacitance values of the third switched capacitor C61, the fourth switched capacitor C62, the fifth switched capacitor C63 and the sixth switched capacitor C64 are not limited by the present embodiment. Those of ordinary skills in the art may adjust a ratio of the weighted addition of the two paths of audio signals by setting the capacitance values of the third switched capacitor C61, the fourth switched capacitor C62, the fifth switched capacitor C63 and the sixth switched capacitor C64.

It shall be noted that the number of filters in the circuit is not limited in the present embodiment. For example, the number of filters in the structure of the audio amplifying circuit shown in FIG. 4-FIG. 6 may be 2, as shown in FIG. 7-FIG. 9.

Figure 7:
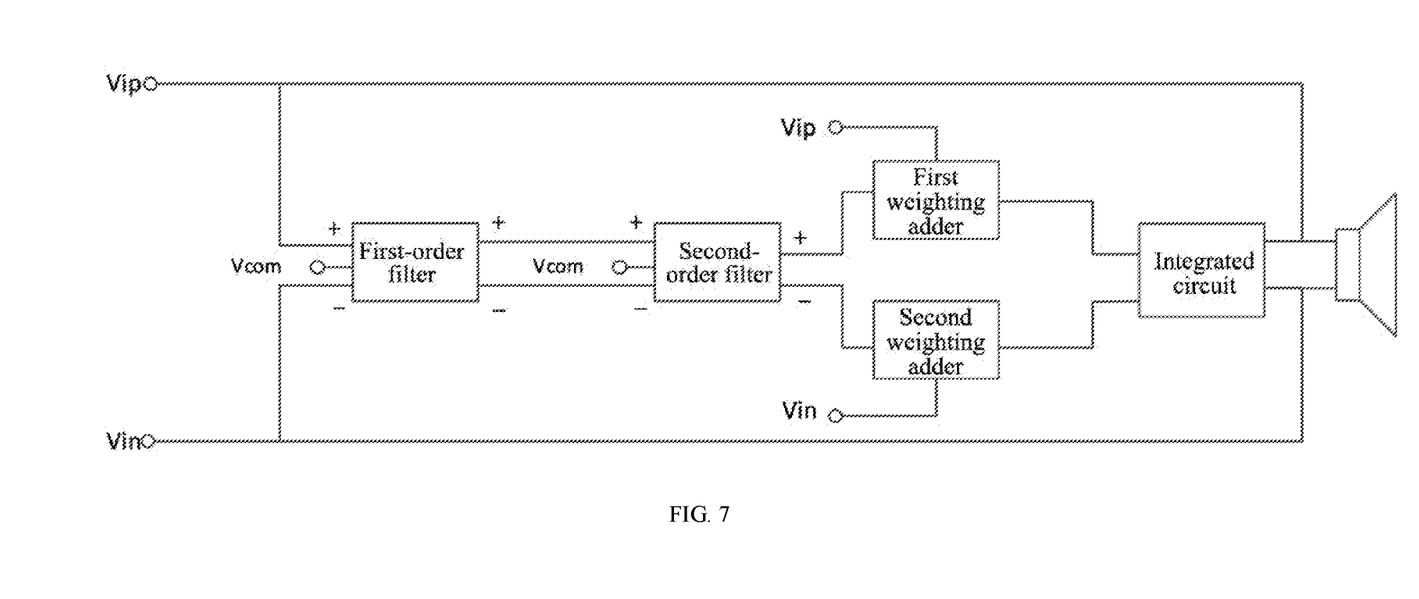
FIG. 7 is a schematic structural diagram of another audio amplifying circuit provided by the fourth embodiment of the present disclosure.

Specifically, as shown in FIG. 7, a positive input end of a first-order filter receives a positive signal Vip of a first-path audio signal, a negative input end of the first-order filter receives a negative signal Vin of the first-path audio signal. Reference ends of the first-order filter and the second-order filter receive a reference voltage signal Vcom. The first-order filter and the second-order filter are connected in series, where the positive output end of the first-order filter is connected to the positive input end of the second-order filter, and the negative output end of the first-order filter is connected to the negative input end of the second-order filter. The positive output end of the second-order filter is connected to a first input end of a first weighting adder, and the negative output end of the second-order filter is connected to a first input end of a second weighting adder. A second input end of the first weighting adder receives a positive signal Vip of the second-path audio signal, a second input end of the second weighting adder receives a negative signal Vin of the second-path audio signal. An output end of the first weighting adder is connected to a first input end of the integrated circuit, and the output end of the second weighting adder is connected to a second input end of the integrated circuit. The output end of the integrated circuit is connected to the player.

Figure 8:
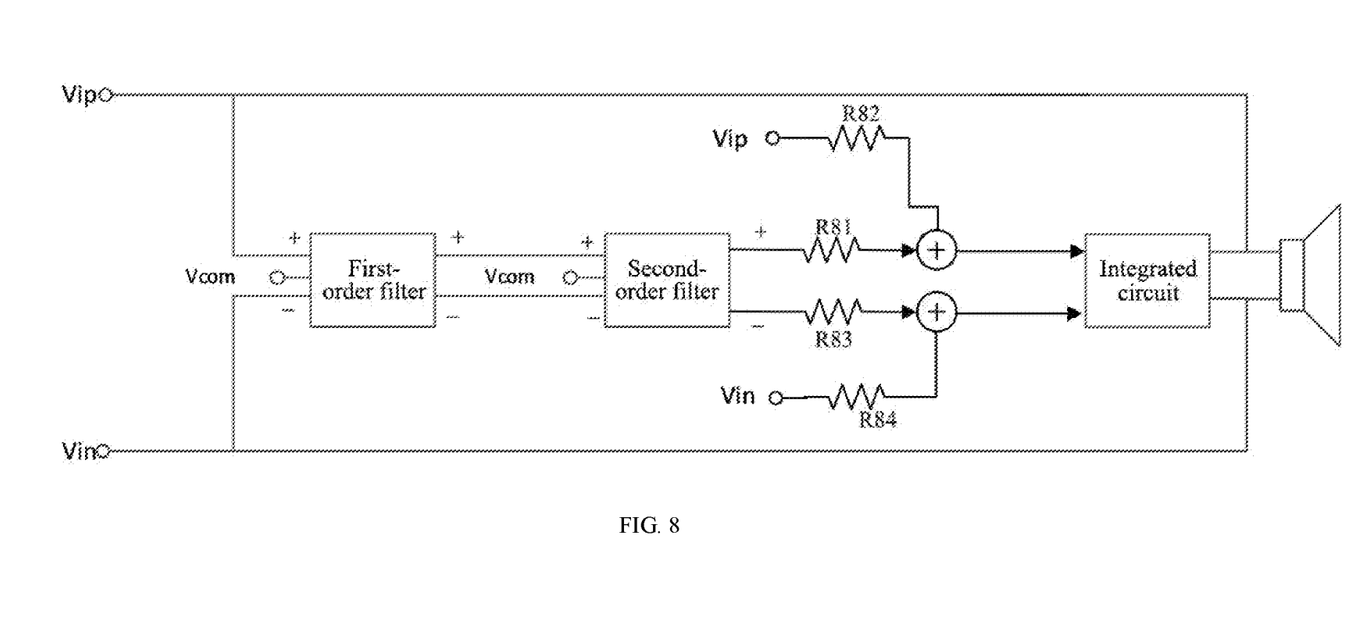
FIG. 8 is a schematic structural diagram of another audio amplifying circuit provided by the fourth embodiment of the present disclosure.
Figure 9:
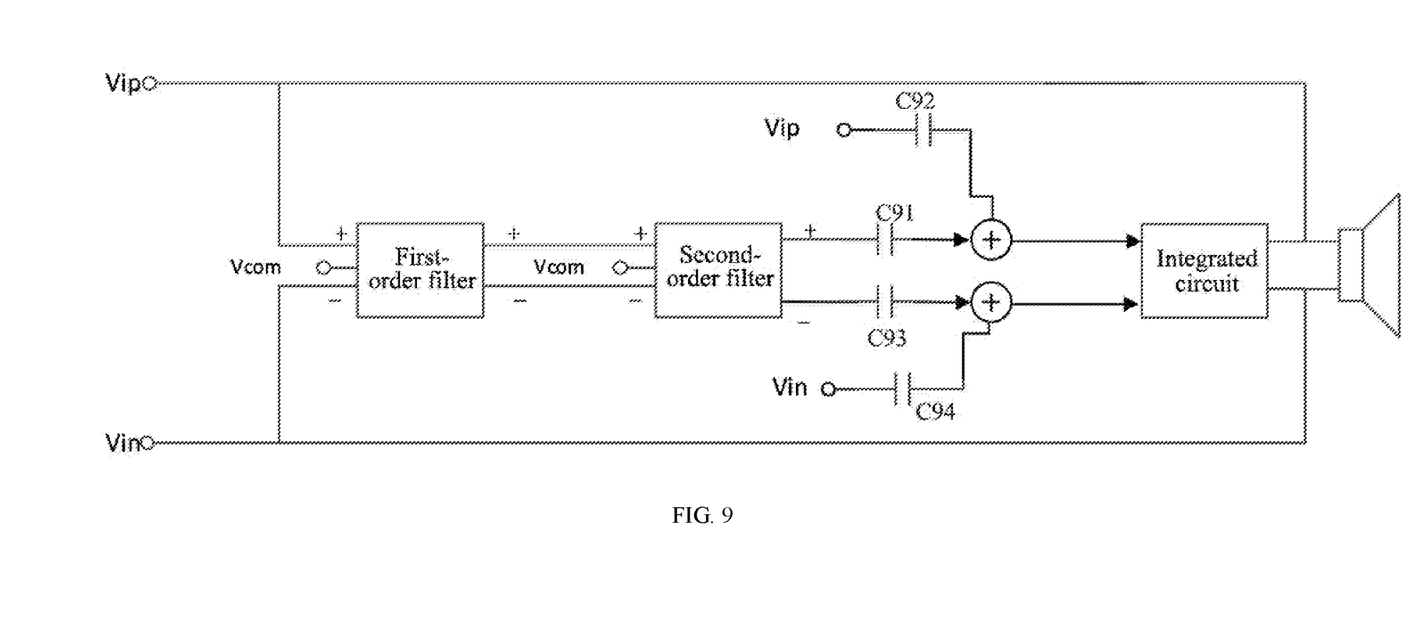
FIG. 9 is a schematic structural diagram of another audio amplifying circuit provided by the fourth embodiment of the present disclosure.

As shown in FIG. 8, the positive signal Vip of the first-path audio signal is connected to the positive input end of the first-order filter, and the negative signal Vin of the first-path audio signal is connected to the negative input end of the first-order filter. Reference ends of the first-order filter and the second-order filter receive a reference voltage signal Vcom. The first-order filter and the second-order filter are connected in series, where an end of the first resistor R81 is connected to a positive output end of the second-order filter, and an end of the second resistor R82 is connected to a positive output end of the second-path original audio signal;

the other end of the first resistor R81 and the other end of the second resistor R82 are both connected to a first input end of the integrated circuit; an end of the third resistor R83 is connected to a negative output end of the second-order filter, and an end of the fourth resistor R84 is connected to a negative output end of the second-path original audio signal; the other end of the third resistor R83 and the other end of the fourth resistor R84 are both connected to a second input end of the integrated circuit. The output end of the integrated circuit is connected to the player.

As shown in FIG. 9, the positive signal Vip of the first-path audio signal is connected to the positive input end of the first-order filter, and the negative signal Vin of the first-path audio signal is connected to the negative input end of the first-order filter. The first-order filter and the second-order filter are connected in series, where the positive output end of the first-order filter is connected to the positive input end of the second-order filter, and the negative output end of the first-order filter is connected to the negative input end of the second-order filter. An end of a first switched capacitor C91 is connected to the positive output end of the second-order filter, and an end of a second switched capacitor C92 is connected to the positive output end of the second-path original audio signal; the other end of the first switched capacitor C91 and the other end of the second switched capacitor C92 are both connected to a first input end of the integrated circuit; an end of a third switched capacitor C93 is connected to the negative output end of the second-order filter, an end of a fourth switched capacitor C94 is connected to the negative output end of the second-path original audio signal; the other end of the third switched capacitor C93 and the other end of the fourth switched capacitor C94 are both connected to a second input end of the integrated circuit. The output end of the integrated circuit which may be consisted of a comparer and a digital circuit is connected to the player.

In an optional implementation, a first buffer (not shown) and a second buffer (not shown) may further be set in the audio amplifying circuit. The positive output end of the second-path original audio signal is connected to an end of the first buffer, and the other end of the first buffer is connected to a first weighting adder; the negative output end of the second-path original audio signal is connected to an end of the second buffer, and the other end of the second buffer is connected to a second weighting adder; where the second-path original audio signal, after passing through the first buffer and the second buffer, and the filtered signal are weighted and added through the weighting adder to obtain the weighted addition signal.

In the present embodiment, by adding the buffer, influence of a digital circuit on a previous-order circuit can be avoided.

In the present embodiment, an original audio signal is divided into two paths, and after one path of the original audio signal passes through N-order filters, a filtered signal is obtained; the other path of the original audio signal and the filtered signal are weighted and added through a weighting adder to obtain a weighting addition signal; and the weighting addition signal passes through an integrated circuit and a player in sequence to output an audio signal. In such way, the other path of the original audio signal is used to improve the linearity of the filtered signal, and the quality of the output audio signal is improved by performing feed forward processing on the signal entering the integrated circuit.

In addition, the present disclosure further provides a playing device, where the playing device is set with the audio amplifying circuit shown in any one of FIG. 1-FIG. 9.

In the description of the present disclosure, it should be understood that the orientations or positional relationships indicated by the terms "up", "down", "front", "back", "vertical", "top", "bottom", "inside" and "outside" are based on the orientations or positional relationships shown in the drawings, only for convenience and simplification of the description of the present disclosure, rather than indicating or implying that the referred apparatuses or elements must have a specific orientation, be constructed and operated in a specific orientation, and therefore they should not be construed as limitations to the present disclosure. In the description of the present disclosure, "multiple" means two or more, unless otherwise specified precisely and specifically.

The terms "first", "second", "third" and "fourth" in the specification and claims of the present disclosure and in the above drawings (if any), are used to distinguish similar objects, and are not necessarily used to describe a specific order or sequence. It should be understood that the data used in such way can be interchanged under appropriate circumstances, so that the embodiments of the present disclosure described here can be implemented, for example, in sequences other than those illustrated or described here. In addition, the terms "including" and "having" and any variations thereof are intended to cover non-exclusive inclusion. For example, a process, method, system, product or device that includes a series of steps or units are not necessarily limited to those steps or units that are clearly listed, but may include other steps or units that are not clearly listed or inherent to these processes, methods, products or devices.

Finally, it should be noted that the above embodiments are only used to illustrate the technical solution of the present disclosure, but not to limit thereto; although the present disclosure has been described in detail with reference to the foregoing embodiments, those skilled in the art should understand that they can still modify the technical solutions described in the foregoing embodiments, or equivalently replace some or all of the technical features; these modifications or substitutions do not make the essence of the corresponding technical solutions depart from the scope of the technical solutions of the embodiments of the present disclosure.

What is claimed is:

1. An audio amplifying circuit, comprising: N-order filters and an integrated circuit; after an original audio signal passes through the N-order filters, a filtered signal is obtained; after the filtered signal passes through the integrated circuit, a corresponding digital signal is output; wherein a number of operational amplifiers adopted in the N-order filters is smaller than N, and N is a natural number greater than 1;

wherein the N-order filters comprise an (i−1)-th-order filter, and I ranges among 2, 3, . . . , N;

the (i−1)-th-order filter is a first-type filter, wherein the first-type filter comprises: an operational amplifier, a first capacitor and a second capacitor; a positive input end of the operational amplifier is connected to a positive output end of a previous-order filter, a negative input end of the operational amplifier is connected to a negative output end of the previous-order filter, a positive output end of the operational amplifier constitutes a positive output end of the filter, a negative output end of the operational amplifier constitutes a negative output end of the filter, an end of the first capacitor is connected to the positive input end of the operational amplifier, and the other end of the first capacitor is connected to the negative output end of the operational amplifier; an end of the second capacitor is connected to the negative input end of the operational amplifier, and the other end of the second capacitor is connected to the positive output end of the operational amplifier;

wherein the N-order filters further comprise an i-th-order filter; the i-th-order filter is a second-type filter, and the second-type filter comprises: a third capacitor, a first resistor, a fourth capacitor and a second resistor, an end of the third capacitor is connected to a positive input end of the (i−1)-th-order filter, the other end of the third capacitor is connected to an end of the first resistor, the other end of the first resistor is connected to the positive output end of the (i−1)-th-order filter, an end of the fourth capacitor is connected to a negative input end of the (i−1)-th-order filter, the other end of the fourth capacitor is connected to an end of the second resistor, and the other end of the second resistor is connected to the negative output end of the (i−1)-th-order filter; or, the second-type filter comprises: a third capacitor, a first switched capacitor, a fourth capacitor and a second switched capacitor, an end of the third capacitor is connected to a positive input end of the (i−1)-th-order filter, the other end of the third capacitor is connected to an end of the first switched capacitor, the other end of the first switched capacitor is connected to the positive output end of the (i−1)-th-order filter, an end of the fourth capacitor is connected to a negative input end of the (i−1)-th-order filter, the other end of the fourth capacitor is connected to an end of the second switched capacitor, and the other end of the second switched capacitor is connected to the negative output end of the (i−1)-th-order filter.

2. The circuit according to claim 1, wherein capacitance values of the third capacitor and the fourth capacitor of the i-th-order filter and the first capacitor and the second capacitor of the (i−1)-th-order filter are the same.

3. The circuit according to claim 1, wherein capacitance values of the third capacitor and the fourth capacitor of the i-th-order filter and the first capacitor and the second capacitor of the (i−1)-th-order filter are the same.

4. The circuit according to claim 1, further comprising: a weighting adder, wherein the original audio signal is divided into two paths, and after a first-path original audio signal passes through the N-order filters, the filtered signal is obtained; a second-path original audio signal and the filtered signal are weighted and added through the weighting adder to obtain a weighted addition signal, and the weighted addition signal passes through the integrated circuit to output the corresponding digital signal.

5. The circuit according to claim 4, wherein the weighting adder comprises: a fifth resistor, a sixth resistor, a seventh resistor and an eighth resistor;

an end of the fifth resistor is connected to a positive output end of a last-order filter, and an end of the sixth resistor is connected to a positive output end of the second-path original audio signal; the other end of the fifth resistor and the other end of the sixth resistor are both connected to a first input end of the integrated circuit;

an end of the seventh resistor is connected to a negative output end of the last-order filter, and an end of the eighth resistor is connected to a negative output end of the second-path original audio signal; the other end of the seventh resistor and the other end of the eighth resistor are both connected to a second input end of the integrated circuit.

6. The circuit according to claim 4, wherein the weighting adder comprises: a third switched capacitor, a fourth switched capacitor, a fifth switched capacitor and a sixth switched capacitor;

an end of the third switched capacitor is connected to a positive output end of a last-order filter, and an end of the fourth switched capacitor is connected to a positive output end of the second-path original audio signal; the other end of the third switched capacitor and the other end of the fourth switched capacitor are both connected to a first input end of the integrated circuit;

an end of the fifth switched capacitor is connected to a negative output end of the last-order filter, and an end of the sixth switched capacitor is connected to a negative output end of the second-path original audio signal; the other end of the fifth switched capacitor and the other end of the sixth switched capacitor are both connected to a second input end of the integrated circuit.

7. The circuit according to claim 4, further comprising: a first buffer and a second buffer;

a positive output end of the second-path original audio signal is connected to an end of the first buffer, and the other end of the first buffer is connected to the weighting adder; a negative output end of the second-path original audio signal is connected to an end of the second buffer, and the other end of the second buffer is connected to the weighting adder; wherein the second-path original audio signal, after passing through the first buffer and the second buffer, and the filtered signal are weighted and added through the weighting adder to obtain the weighted addition signal.

8. An audio amplifying circuit, comprising: N-order filters, a weighting adder, an integrated circuit and a player; wherein after a first-path original audio signal passes through the N-order filters, a filtered signal is obtained; a second-path original audio signal and the filtered signal are weighted and added through the weighting adder to obtain a weighted addition signal; and the weighted addition signal passes through the integrated circuit and the player in sequence to output an audio signal;

wherein a number of operational amplifiers adopted in the N-order filters is smaller than N, and N is a natural number greater than 1;

wherein the N-order filters comprise an (i−1)-th-order filter, and I ranges among 2, 3, . . . , N;

the (i−1)-th-order filter is a first-type filter, wherein the first-type filter comprises: an operational amplifier, a first capacitor and a second capacitor; a positive input end of the operational amplifier is connected to a positive output end of a previous-order filter, a negative input end of the operational amplifier is connected to a negative output end of the previous-order filter, a positive output end of the operational amplifier constitutes a positive output end of the filter, a negative output end of the operational amplifier constitutes a negative output end of the filter, an end of the first capacitor is connected to the positive input end of the operational amplifier, and the other end of the first capacitor is connected to the negative output end of the operational amplifier; an end of the second capacitor is connected to the negative input end of the operational amplifier, and the other end of the second capacitor is connected to the positive output end of the operational amplifier;

wherein the N-order filters further comprise an i-th-order filter; the i-th-order filter is a second-type filter, and the second-type filter comprises: a third capacitor, a first resistor, a fourth capacitor and a second resistor, an end of the third capacitor is connected to a positive input end of the (i−1)-th-order filter, the other end of the third capacitor is connected to an end of the first resistor, the other end of the first resistor is connected to the positive output end of the (i−1)-th-order filter, an end of the fourth capacitor is connected to a negative input end of the (i−1)-th-order filter, the other end of the fourth capacitor is connected to an end of the second resistor, and the other end of the second resistor is connected to the negative output end of the (i−1)-th-order filter; or, the second-type filter comprises: a third capacitor, a first switched capacitor, a fourth capacitor and a second switched capacitor, an end of the third capacitor is connected to a positive input end of the (i−1)-th-order filter, the other end of the third capacitor is connected to an end of the first switched capacitor, the other end of the first switched capacitor is connected to the positive output end of the (i−1)-th-order filter, an end of the fourth capacitor is connected to a negative input end of the (i−1)-th-order filter, the other end of the fourth capacitor is connected to an end of the second switched capacitor, and the other end of the second switched capacitor is connected to the negative output end of the (i−1)-th-order filter.

9. The circuit according to claim 8, wherein the weighting adder comprises: a fifth resistor, a sixth resistor, a seventh resistor and an eighth resistor;

an end of the fifth resistor is connected to a positive output end of a last-order filter, and an end of the sixth resistor is connected to a positive output end of the second-path original audio signal; the other end of the fifth resistor and the other end of the sixth resistor are both connected to a first input end of the integrated circuit;

an end of the seventh resistor is connected to a negative output end of the last-order filter, and an end of the eighth resistor is connected to a negative output end of the second-path original audio signal; the other end of the seventh resistor and the other end of the eighth resistor are both connected to a second input end of the integrated circuit.

10. The circuit according to claim 8, wherein the weighting adder comprises: a third switched capacitor, a fourth switched capacitor, a fifth switched capacitor and a sixth switched capacitor;

an end of the third switched capacitor is connected to a positive output end of a last-order filter, and an end of the fourth switched capacitor is connected to a positive output end of the second-path original audio signal; the other end of the third switched capacitor and the other end of the fourth switched capacitor are both connected to a first input end of the integrated circuit;

an end of the fifth switched capacitor is connected to a negative output end of the last-order filter, and an end of the sixth switched capacitor is connected to a negative output end of the second-path original audio signal; the other end of the fifth switched capacitor and the other end of the sixth switched capacitor are both connected to a second input end of the integrated circuit.

11. The circuit according to claim 8, further comprising: a first buffer and a second buffer;

a positive output end of the second-path original audio signal is connected to an end of the first buffer, and the other end of the first buffer is connected to the weighting adder; a negative output end of the second-path original audio signal is connected to an end of the second buffer, and the other end of the second buffer is connected to the weighting adder; wherein the second-path original audio signal, after passing through the first buffer and the second buffer, and the filtered signal are weighted and added through the weighting adder to obtain the weighted addition signal.

12. A playing device, comprising the audio amplifying circuit according to claim 1.

* * * * *